United States Patent
Mannens

(10) Patent No.: US 10,420,241 B2
(45) Date of Patent: Sep. 17, 2019

(54) REMOTE PHY IN A BK NODE

(71) Applicant: ARRIS Enterprises LLC, Suwanee, GA (US)

(72) Inventor: Johan Mannens, Huise (BE)

(73) Assignee: ARRIS Enterprises LLC, Suwanee, GA (US)

(*) Notice: Subject to any disclaimer, the term of this patent is extended or adjusted under 35 U.S.C. 154(b) by 0 days.

(21) Appl. No.: 15/828,904

(22) Filed: Dec. 1, 2017

(65) Prior Publication Data

US 2018/0160559 A1 Jun. 7, 2018

Related U.S. Application Data

(60) Provisional application No. 62/428,905, filed on Dec. 1, 2016.

(51) Int. Cl.
| | |
|---|---|
| *H05K 5/00* | (2006.01) |
| *H05K 7/14* | (2006.01) |
| *G02B 6/42* | (2006.01) |
| *H04Q 1/02* | (2006.01) |
| *H04Q 1/18* | (2006.01) |
| *H04B 3/52* | (2006.01) |

(52) U.S. Cl.
CPC .............. *H05K 7/14* (2013.01); *G02B 6/42* (2013.01); *G02B 6/4279* (2013.01); *H04Q 1/02* (2013.01); *H04Q 1/09* (2013.01); *H04Q 1/18* (2013.01); *G02B 6/4246* (2013.01); *H04B 3/52* (2013.01)

(58) Field of Classification Search
CPC ........................................................ H05K 5/00
See application file for complete search history.

(56) References Cited

U.S. PATENT DOCUMENTS

| | | | | |
|---|---|---|---|---|
| 7,054,163 | B2 * | 5/2006 | Coffey | ............ H04Q 1/14 361/730 |
| 2008/0260066 | A1 * | 10/2008 | Cai | ............ H03F 1/3294 375/297 |
| 2010/0135265 | A1 | 6/2010 | Asati et al. | |

FOREIGN PATENT DOCUMENTS

WO 2007/111678 A2 10/2007

OTHER PUBLICATIONS

Combined Search and Examination Report, Re: GB Application No. GB1720095.7, dated May 23, 2018.

* cited by examiner

*Primary Examiner* — Jerry Wu
(74) *Attorney, Agent, or Firm* — Lori Anne D. Swanson

(57) ABSTRACT

A Remote PHY device (RPD) may be modified to be integrated into a BK node configuration. One or more embodiments include techniques that may offer a solution to overcome space & power budget limitation in the BK node housing when integrating a Remote PHY device into an existing BK node configuration, with minimum impact to existing radio frequency (RF) amplifier modules. The modified RPD/BK node may span multiple slots within a BK housing. In embodiments, the integrated RPD/BK solution includes moving from dedicated slots to the BK amplifier's transceiver and line amplifier functionality. The circuitry for the BK amplifier may remain the same, however the transceiver and AB line amplifier functionality may be moved to the RPD and the back plate, whereby the RPD and back plate with the BK amplifier functionality spans multiple slots.

18 Claims, 11 Drawing Sheets

| POSITION | DEVICE | |
|---|---|---|
| 1 | OPT. TRANCEIVER | ~140a |
| 2 | OPT. TRANCEIVER-REDUNDANT | ~140b |
| 3 | AB-AMPLIFIER ABVr | ~142 |
| 4 | FREE | |
| 5 | C-AMPLIFIER CVr | ~144a |
| 6 | RETURN PATH COMBINER AMPLIFIER RkSm | ~146 |
| 7 | FREE | |
| 8 | C-AMPLIFIER CVr | ~144b |
| 9 | ADAPTER RS485 ZG 24 OR ZG34 | ~202 |
| 10 | PUS-StrVGt | ~204 |
| 11 | PUS-StrVGt | ~206 |
| 12 | FREE | |

FIG. 2B

REMOTE PHY IN A BK NODE

BACKGROUND

Most of hybrid fiber coaxial (HFC) networks in Germany are built using the "BK" Standard. BK is a German standard meaning BundesKabelnetz, and it includes standardization of cable distribution networks that end at the home connection point. Presently, the largest cable operators in Germany have upgraded based on the BK standard. For example, 90% of cable operator Kabel Deutschland's (KDG) network and around 70% of Unitymedia's network is based on the BK standard. The former KabelBW (KBW) network was upgraded, though some of the KBW network resembles generic HFC rather than BK.

The BK standard defines cable types (mostly buried coax), node housing and modules, signal levels at all points in the network, and detailed specifications for network architecture, connectors, taps, and other network elements. As the BK standard has evolved, so has Remote PHY. Remote PHY refers to the technique of moving the PHY circuit out of a device such as a Converged Cable Access Platform (CCAP) and putting the PHY circuit at the end of a network. Remote PHY builds upon the work started with the modular cable modem termination system (CMTS) (M-CMTS) and Modular Headend Architecture (MHA) at CableLabs.

Thus, techniques for integrating Remote PHY with BK technology are desirable.

BRIEF DESCRIPTION OF THE DRAWINGS

Further details of the present invention are explained with the help of the attached drawings in which:

FIG. 2B provides an example configuration of modules within the 12 slots in the BK housing shown in FIG. 2a.

DETAILED DESCRIPTION

Disclosed herein are techniques for integrating a Remote PHY device into a BK node configuration. As disclosed herein, one or more embodiments include techniques that may offer a solution to overcome space & power budget limitation in the BK node housing when integrating a Remote PHY device into an existing BK node configuration, with minimum impact to existing radio frequency (RF) amplifier modules.

In a Remote PHY System, the integrated CCAP is separated into two distinct components. The first component is the CCAP Core and the second component is the R-PHY Device (RPD). The CCAP Core includes both a CMTS Core for Data Over Cable Service Interface Specification (DOCSIS) and an Edge Quadrature Amplitude Modulator (EQAM) Core for Video.

The CMTS Core contains the DOCSIS Media Access Control (MAC) and the upper layer DOCSIS protocols. This includes all signaling functions, downstream and upstream bandwidth scheduling, and DOCSIS framing. The DOCSIS functionality of the CMTS Core is defined by the existing DOCSIS Specifications. The EQAM Core contains all the video processing functions that an EQAM provides today.

The Remote PHY Device (RPD) includes mainly PHY related circuitry, such as downstream QAM modulators, upstream QAM demodulators, together with pseudo-wire logic to connect to the CCAP Core. The RPD platform is a physical layer converter whose functions include 1) to convert downstream DOCSIS, Moving Picture Experts Group (MPEG) video and out of band (OOB) signals received from a CCAP Core over a digital medium such as Ethernet or passive optical network (PON) to analog for transmission over RF or linear optics and/or 2) to convert upstream DOCSIS and OOB signals received from an analog medium such as RF or linear optics to digital for transmission over Ethernet or PON to a CCAP Core.

Figure 1A:
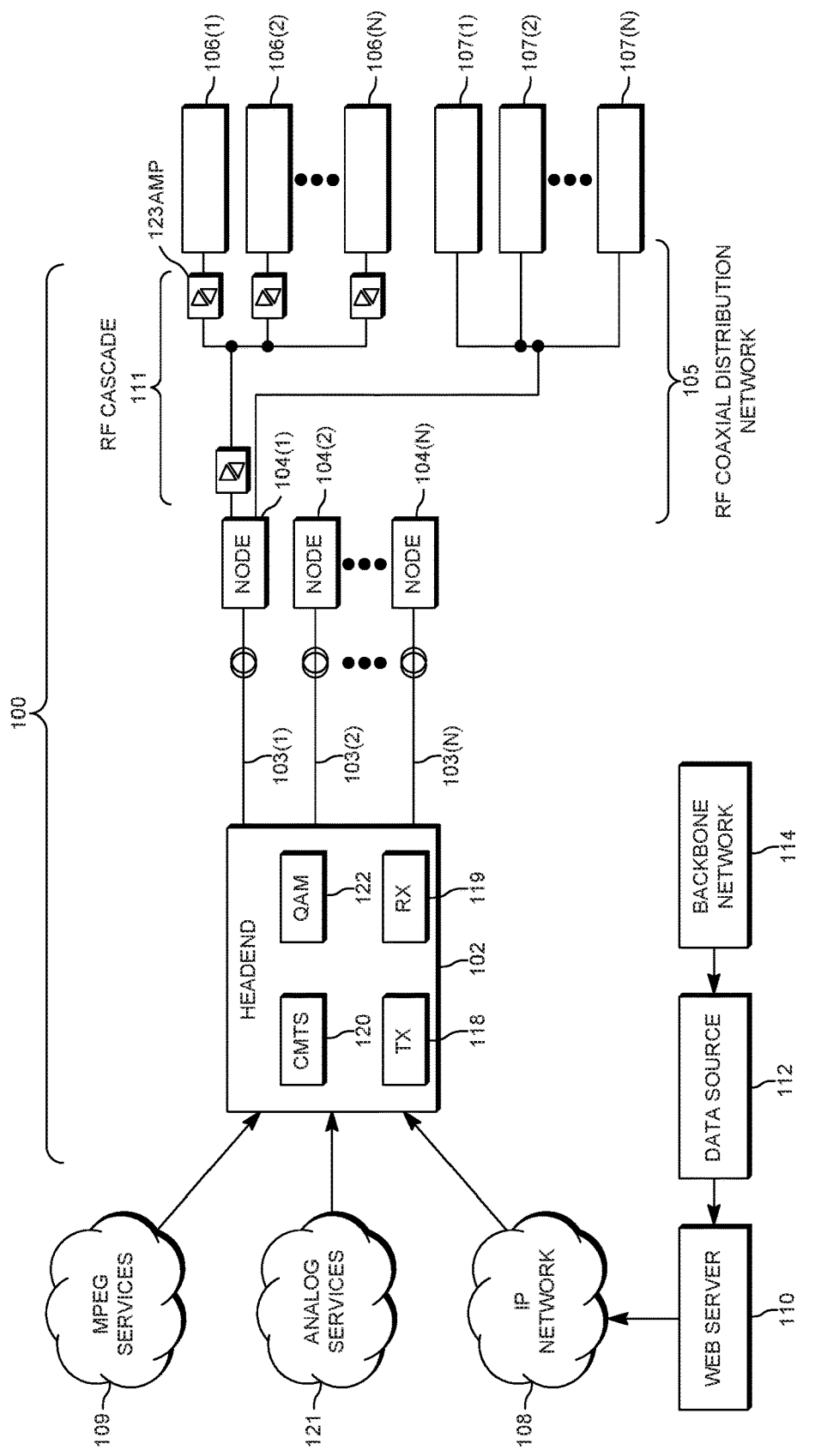
FIG. 1A illustrates an example cable television (CATV) system capable of delivering high-definition digital entertainment and telecommunications.

FIG. 1A illustrates an example cable television (CATV) system 100 capable of delivering high-definition digital entertainment and telecommunications such as video, voice, and high-speed Internet services. Generally speaking, the CATV system 100 refers to the operational (e.g., geographical) footprint of an entertainment and/or information services franchise that provides entertainment and/or information services to a subscriber base spanning one or more towns, a region, or a portion thereof. Particular entertainment and/or information services offered by a franchise (e.g., entertainment channel lineup, data packages, etc.) may differ from system to system. Some large cable companies operate several cable communication systems (e.g., in some cases up to hundreds of systems), and are known generally as Multiple System Operators (MSOs). Although a cable network is described, other networks may be used.

The cable network can take the form of an all-coax, all-fiber, or hybrid fiber/coax (HFC) network. For purposes of illustration, FIG. 1A depicts a hybrid fiber-coaxial (HFC) network. An HFC network is a broadband network that combines optical fiber and coaxial cable, strategically placing fiber nodes to provide services to a plurality of homes. It should be realized that the disclosed techniques may be employed in various networks and the HFC network is merely shown as a non-limiting example.

The network shown in FIG. 1A is a HFC broadband network that combines the use of optical fiber and coaxial connections. The network includes a headend 102 that receives analog video signals and digital bit streams representing various services (e.g., video, voice, and Internet) from various digital information sources. For example, the headend may receive content from one or more video on demand (VOD) servers, IPTV broadcast video servers, Internet video sources, or other suitable sources for providing Internet Protocol (IP) content.

FIG. 1A includes an IP network 108, MPEG services 109, and analog services 121. The IP network 108 includes a web server 110, and a data source 112. The web server 110 is a streaming server that uses IP to deliver video-on-demand, audio-on-demand, and pay-per view streams to the IP network 108. The IP data source 112 may be connected to a regional area or backbone network 114 that transmits Internet Protocol. For example, the regional area network can be or include the Internet or an IP-based network, a computer network, a web-based network or other suitable wired or wireless network or network system.

At the headend 102, the various services are encoded, modulated and up-converted onto radio frequency (RF) carriers, combined onto a single electrical signal and inserted into a broadband optical transmitter (Tx) 118. A fiber optic network 103 extends from the cable operator's master/regional headend 102 to a plurality of fiber optic nodes 104(1) . . . 104(n). The headend 102 may contain an optical transceiver (optical transmitter 118 and optical return receiver (Rx) 119) to send and receive optical communications through the optical fibers 103. Regional headends and/or neighborhood hub sites may also exist between the headend and one or more nodes. The fiber optic portion 103 of the example HFC network extends from the headend to the regional headend/hub and/or to a plurality of nodes 104(1)-(n). The optical transmitter 118 converts the electrical signal to a downstream optically modulated signal that is sent to the nodes 104. In turn, the optical nodes 104 convert inbound (forward) optical signals to Radio Frequency (RF) energy for network elements 106. In the return path, optical nodes 104 convert return RF signals to optical signals, and send the optical signals through optical network 103 to return receiver 119, which can convert the optical signals back to electrical signals. In one example, a node is a local digital hub that transports local requests over the optical network and back to the customer home via the coaxial cables.

Each of the nodes (104a-n) serves a service group made up of one or more customer locations. By way of example, a single node 104(1) may be connected to thousands of cable modems or other network elements 106. In an example, a fiber node 104 serves anywhere from 1 to 2000 customer locations. In an HFC network, the fiber optic node 104 may be connected to a plurality of client devices 106 via a coaxial cable portion 105 or a combined fiber optic/coaxial cable portion 105 of the network. In implementations, each node 104 may include a broadband optical receiver to convert the downstream optically modulated signal received from the headend/hub to an electrical signal provided to the subscribers' network elements 106(1) . . . 106(n) via a coaxial portion 105 of the HFC network. Each node 106 may be connected to many network elements 102 of subscribers via a coaxial cable portion of the network represented by the RF cascade 103. Signals may pass from the node 104 to the client devices 106, 107 via the RF cascade 111, which may be comprised of multiple amplifiers 123 and active or passive devices including cabling, taps, splitters, and in-line equalizers. In one example, client devices 106 may be connected via amplifiers 123, and client devices 107 do not have signals amplified in network 105. The tap is the customer's drop interface to the coaxial system. Taps are designed in various values to allow amplitude consistency along the distribution system.

The client devices 106 may reside at a customer location, such as a home of a cable subscriber, and are connected to the cable modem termination system (CMTS) 120 or comparable component located in a headend. A client device 106 may be a modem, e.g., cable modem, MTA (media terminal adaptor), set top box, terminal device, television equipped with set top box, Data Over Cable Service Interface Specification (DOCSIS) terminal device, customer premises equipment (CPE), router, or like electronic client, end, or terminal devices of subscribers. For example, cable modems and IP set top boxes may support data connection to the Internet and other computer networks via the cable network, and the cable network provides bi-directional communication systems in which data can be sent downstream from the headend 102 to a subscriber and upstream from a subscriber to the headend 102.

The techniques disclosed herein may be applied to systems compliant with DOCSIS. The cable industry developed the international Data Over Cable System Interface Specification (DOCSIS®) protocol to enable the delivery of IP data packets over cable systems. In general, DOCSIS defines the communications and operations support interface requirements for a data over cable system. For example, DOCSIS defines the interface requirements for cable modems involved in high-speed data distribution over cable television system networks. However, it should be understood that the techniques disclosed herein may apply to other systems designed for digital services transmission, such as digital video or Ethernet Protocol over Coax. Examples herein referring to DOCSIS are illustrative and representative of the application of the techniques to a broad range of services carried over coax.

References are made herein to a Cable Modem Termination System (CMTS) in the headend 102, also developed by the cable industry. In general, the CMTS is a component located at the headend or hub site of the network that exchanges signals between the headend and client devices within the cable network infrastructure. In an example DOCSIS arrangement, for instance, the CMTS and the cable modem may be the endpoints of the DOCSIS protocol, with the hybrid fiber coax (HFC) cable plant there between. It will be appreciated that system 100 includes one CMTS for illustration clarity only—indeed, it is customary that multiple CMTS units and their CMs are managed through the management network.

The CMTS 120 hosts downstream and upstream ports and contains numerous receivers, each receiver handling communications between hundreds of end user network elements connected to the broadband network. For example, each CMTS 120 receiver may be connected to several modems of many subscribers, e.g., a single receiver may be connected to hundreds of modems which vary widely in communication characteristics. In many instances several nodes, such as fiber optic nodes 104(1), may serve a particular area of a town or city. DOCSIS enables IP packets to pass between devices on either side of the link between the CMTS and the cable modem.

In an HFC network that complies with a BK standard, the nodes may include BK technology. For example, a BK cabinet may include an optical transceiver, another optical transceiver for redundancy, a Class AB amplifier, one or more C-line amplifiers, adaptors and power supplies. Today's BK chassis are typically remotely powered and have a maximum power consumption and a maximum heat dissipation. A BK chassis is often architected at (B×H×T): 618×435×190 mm and a BK module is architected at (B×H×T): 40×250×115 mm. In Germany, where BK technology is commonly employed, the HFC networks have been upgraded from 450 MHz one-way to 65/862 MHz two-way communication networks, the majority of taps specified up to 450 MHz. To compensate the loss of taps when going beyond 450 MHz, a steep slope for the C-line amplifier has been defined.

Traffic transferred from the headend 102 to a receiving device 106(1) . . . 106(n) can be said to travel in a downstream direction; conversely, traffic transferred from a receiving device 106(1) . . . 106(n) to the headend 102 can be said to travel in an upstream direction. Downstream (also referred to as forward path) optical communications over the optical fiber 103 are typically converted at the nodes 104 to Radio Frequency (RF) communications for transmission over the coaxial cable in network 105. Conversely, upstream (also referred to as return path) RF communications from the network elements are provided over the coaxial cables in network 105 and are typically converted at nodes 104 to optical communications for transmission over the optical fiber 103 to the headend 102. Each node 104 may contain a reverse/return path transmitter that is able to relay communications upstream from a subscriber network element 106 to the headend 102.

It should be understood that the CMTS is a non-limiting example of a component in the cable network that may be used to exchange signals between the headend and client devices within the cable network infrastructure. For example, other non-limiting examples include the Modular CMTS (M-CMTSTM) architecture, a Converged Cable Access Platform (CCAP), or a STB control system.

An EdgeQAM (EQAM) or EQAM modulator may be in the headend or hub device for receiving packets of digital content, such as video or data, re-packetizing the digital content into an MPEG transport stream, and digitally modulating the digital transport stream onto a downstream RF carrier using Quadrature Amplitude Modulation (QAM). Edge QAMs may be used for both digital broadcast, and DOCSIS downstream transmission. In CMTS or M-CMTS implementations, data and video QAMs may be implemented on separately managed and controlled platforms. In CCAP implementations, the CMTS and edge QAM functionality may be combined in one hardware solution, thereby combining data and video delivery.

Orthogonal frequency-division multiplexing (OFDM) may utilize a multitude of lower amplitude subcarriers (compared to single carrier QAM signals). For example, while a conventional DOCSIS QAM carrier is 6 MHz wide in the USA (7 MHz or 8 MHz in Europe), the CATV system may employ orthogonal frequency division multiplexing (OFDM) technology with OFDM carriers that are approximately 25 kHz to 50 kHz wide. Thus, where previously 100 QAM carriers were used, thousands of OFDM subcarriers may be used. OFDM technology may be suitable for noisy signal conditions and may enable the use of more of the available spectrum without reducing the quality of service. In example implementations, a cable network may use QAM modulation for relatively high downstream speeds and significantly boost upstream speeds using OFDM, even with reduced return bandwidth.

Figure 1B:
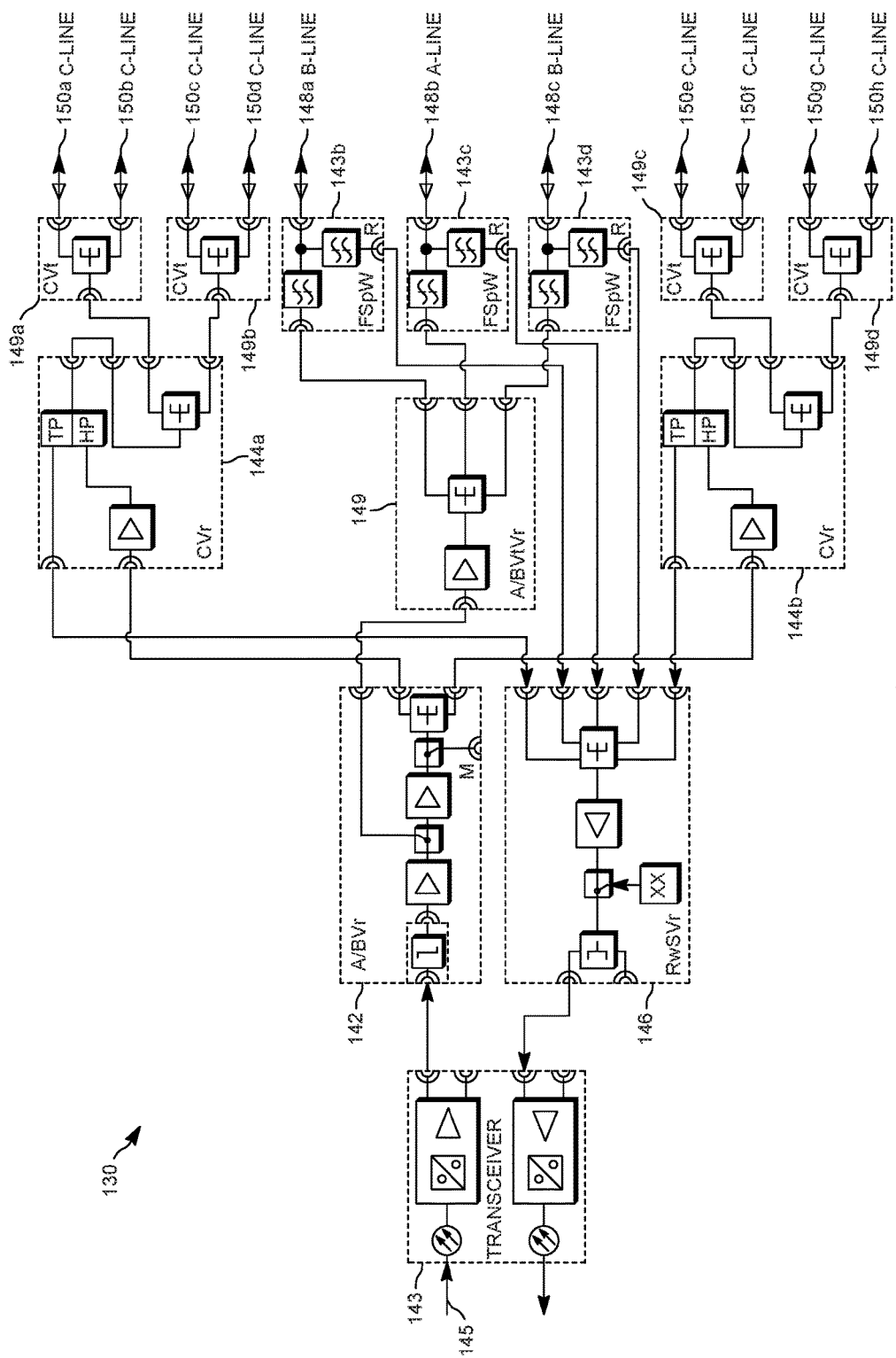
FIG. 1B depicts an example BK amplifier configuration located at a node.

FIG. 1B depicts an example BK amplifier configuration 130 located at a node, the BK configuration including an optical transceiver 143. The input 145 (A/B line in) illustrates trunk lines in to the BK amplifier. The BK amplifier 140 also includes A/BVr: A/B RF line amplifiers 142 and 149. The A/B line amplifier 142 typically has one input for a pluggable equalizer, 2 outputs for C-modules, and 3 outputs for A/B trunk lines. The BK amplifier 140 may also include CVr: C RF amplifiers 144a and 144b, and RwSVr: Return path combiner RF amplifier 146. The CVt C line distributor components 149(a)-(d) output C1-C8 outputs 150(a)-(h), which illustrate the C-lines out. The FspWs 143b, 143c, 143d components may be downstream/upstream diplex filter with remote power injection. AC/DC components (not shown) may provide power to the BK amplifier 140.

The return path amplifier 146 may combine return path signals in a certain frequency range, and the remote feed splitter FspW outputs over lines 148(a)-(c), which illustrate a B-line, an A-line, and B-line, respectively lines out. For example, the return paths from the CVt C-line distributor components may be routed to the return path RF amplifier 146 and combined with the return path signals from the input line. The FSpWs may be diplex filters that together with the CVt line distributes create 13 input/output ports for the BK amplifier 140.

Figure 1C:
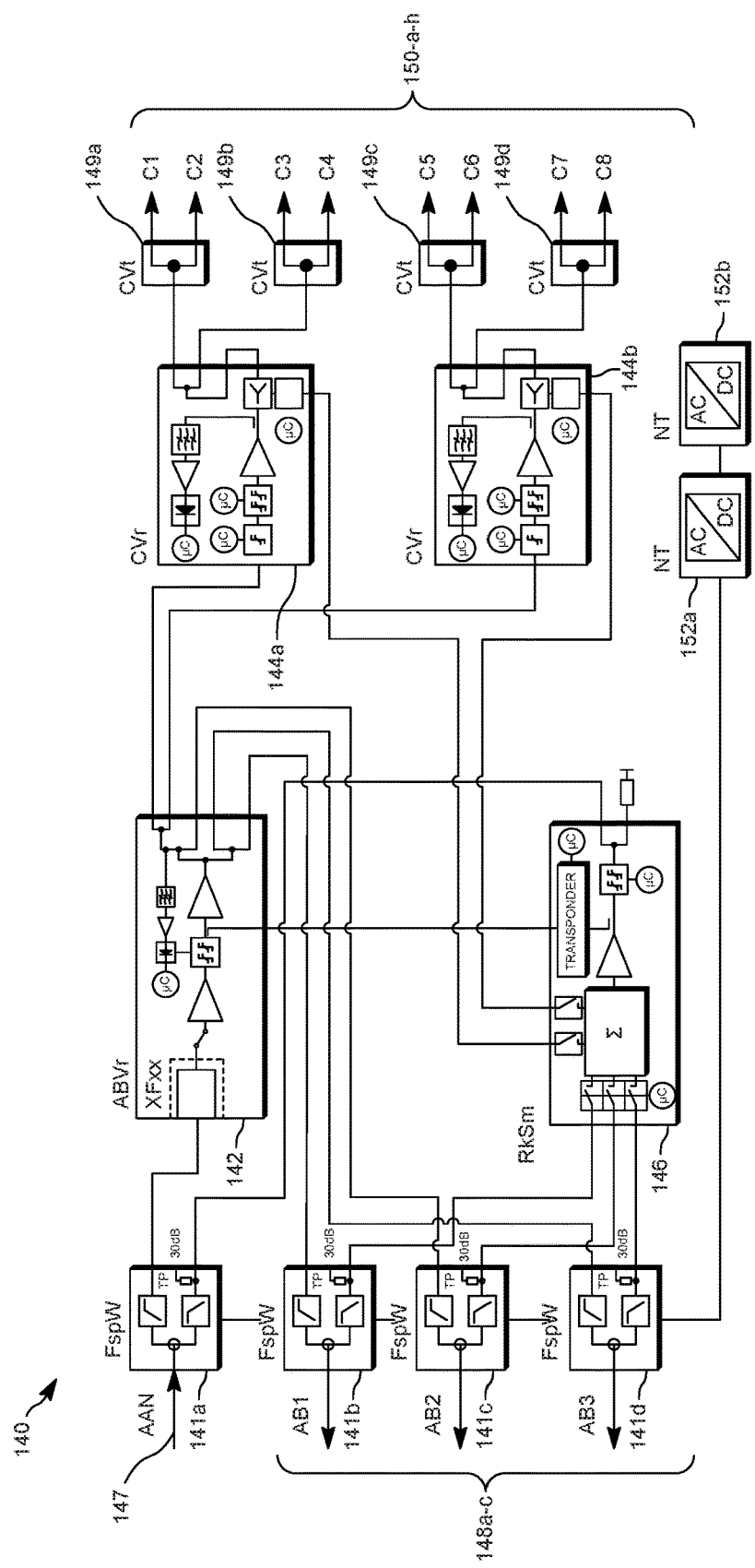
FIG. 1C depicts an example BK coax amplifier which is similar to the BK node amplifier shown in FIG. 1B, but does not include a transceiver.

FIG. 1C depicts an example BK coax amplifier which is similar to the BK node amplifier but does not include a transceiver. The FspW 143(a)-(d), the FspW 143(a) an input port and the FspW 143(b), (c), and (d) shown with a return path. The FspWs 143(a)-(d) may be downstream/upstream diplex filter with remote power injection. The Aan line 147 (A/B line in) illustrates trunk lines in to the BK amplifier. The BK amplifier 140 also includes an A/BVr: A/B RF line amplifier 142. The A/B line amplifier 142 typically has one input for a pluggable equalizer, 2 outputs for C-modules, and 3 outputs for A/B trunk lines. The BK amplifier 140 may also include CVr: C RF amplifiers 144a and 144b, and RwSVr: Return path combiner RF amplifier 146. The CVt C line distributor components 149(a)-(d) output C1-C8 outputs 150(a)-(h), which illustrate the C-lines out. The NT AC/DC components 152a and 152b may provide power to the FspWs 141(a)-(d).

The return path amplifier 146 may combine return path signals in a certain frequency range, and the remote feed splitter FspW outputs over lines AB1, AB2, AB3148(a)-(c), which illustrate A/B lines out. For example, the return paths from the CVt C-line distributor components may be routed to the return path RF amplifier 146 and combined with the return path signals from the Aan line. Thus, the FspW may be a diplex filter and together with the CVt line distributes create 12 input/output ports for the BK amplifier 140.

Figure 2A:
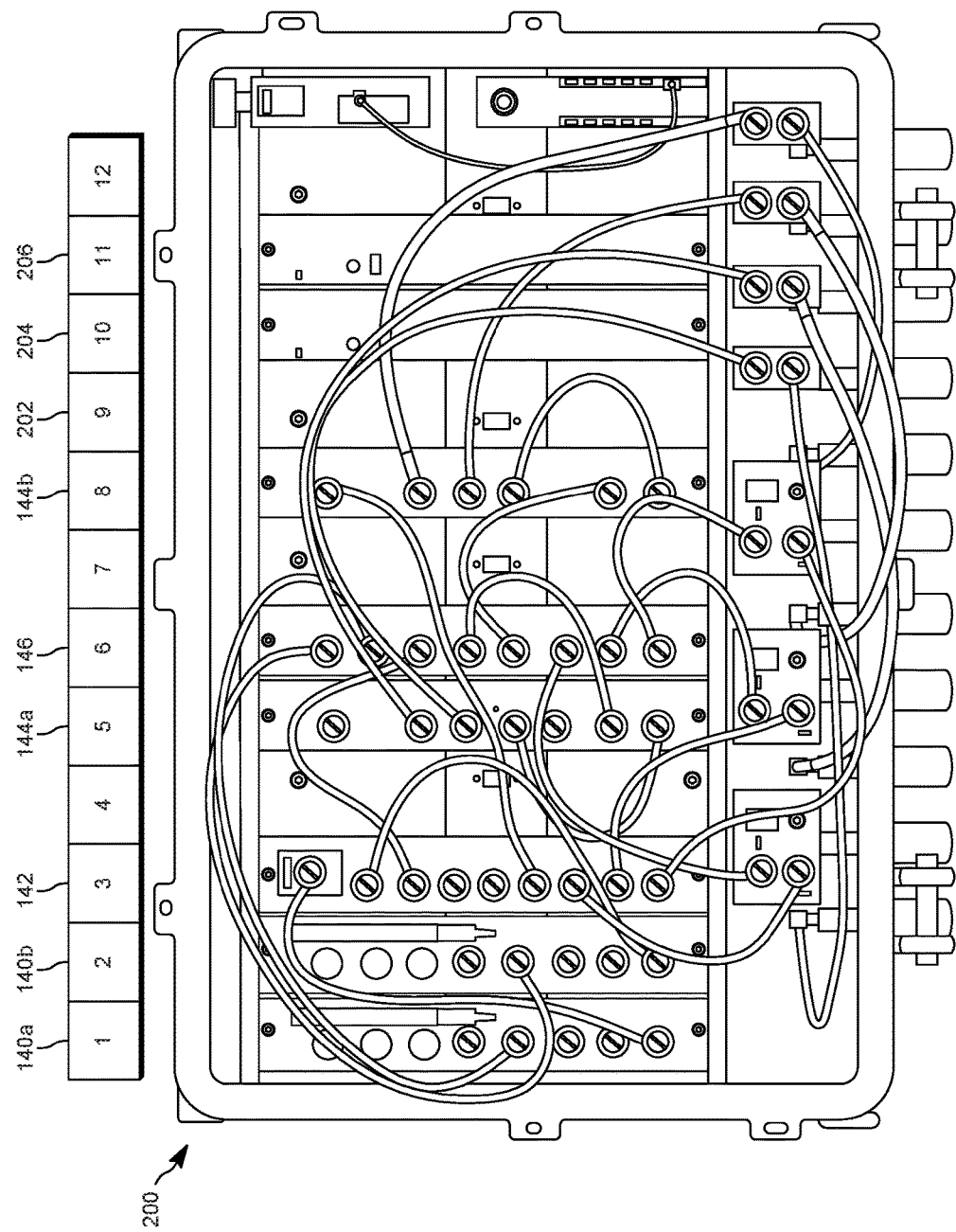
FIG. 2A depicts a BK housing with 12 slots.

As shown in FIGS. 2A and 2B, the BK housing 200 has 12 slots of which the first 2 slots 140a and 140b are allocated for optical transceiver modules. Slots The RS-485 slot 202, also known as TIA-485(-A), a driver or receiver used in the network for communicating, where RS-485 is a standard defining the electrical characteristics of drivers and receivers for use in communications systems. Slots 10 and 11, 204 and 206, are power supply slots. The remaining slots are either free or represent modules depicted in FIG. 1B. In the BK standard, each slot has a maximum heat transfer capability of about 15 Watts to the node housing. The current RPD development has a power envelop of 35 to 40 Watts.

Disclosed herein are techniques for developing an adaptor plate with integrated RF amplification, similar to an A/B amplifier in the BK technology, but using the adaptor plate spanning multiple slots and able to accept a component, instead of a separate slot in the BK housing dedicated to the A/B amplifier. The adaptor plate is otherwise referred to herein as a bracket, where the adaptor plate or bracket may be inserted in to one or more slots in the BK housing and accept one or more components. The adaptor plate may include active components configured for amplification.

In embodiments, the adaptor plate may be configured to span multiple slots in the BK node housing. In embodiments, the adaptor plate is sized to fit into the 3 slots of a BK node housing. The adaptor plate spanning multiple slots increases the maximum heat transfer (# of slots×maximum heat transfer). As discussed above, each slot may have a maximum heat transfer of 15 W, thus a design optimized to fit into 3 slots of a BK node enables a maximum heat transfer up to 45 Watts.

In embodiments, the adaptor plate has an interface between a legacy RPD and the BK housing. For example, the RPD may be configured to fit on top of the adaptor plate to interface with the BK housing via an RF interface and a power interface. In embodiments, the adaptor plate includes RF amp circuitry built in that leverages a standard RPD RF input/output for interfacing to the standard A/B amplifier input/output interfaces Today, there are over 5000 BK nodes today in the UM network. DWDM links with limited NC capacity are used for longer fiber links, connecting over 1000 fiber nodes. To move towards a remote PHY device (RPD) is limited based on bandwidth availability in the DWDM links. However, RPDs may be desirable in node upgrades/segmentations as these limitations are addressed. Thus, the DWDM links may be upgraded to RPDs.

Figure 3A:
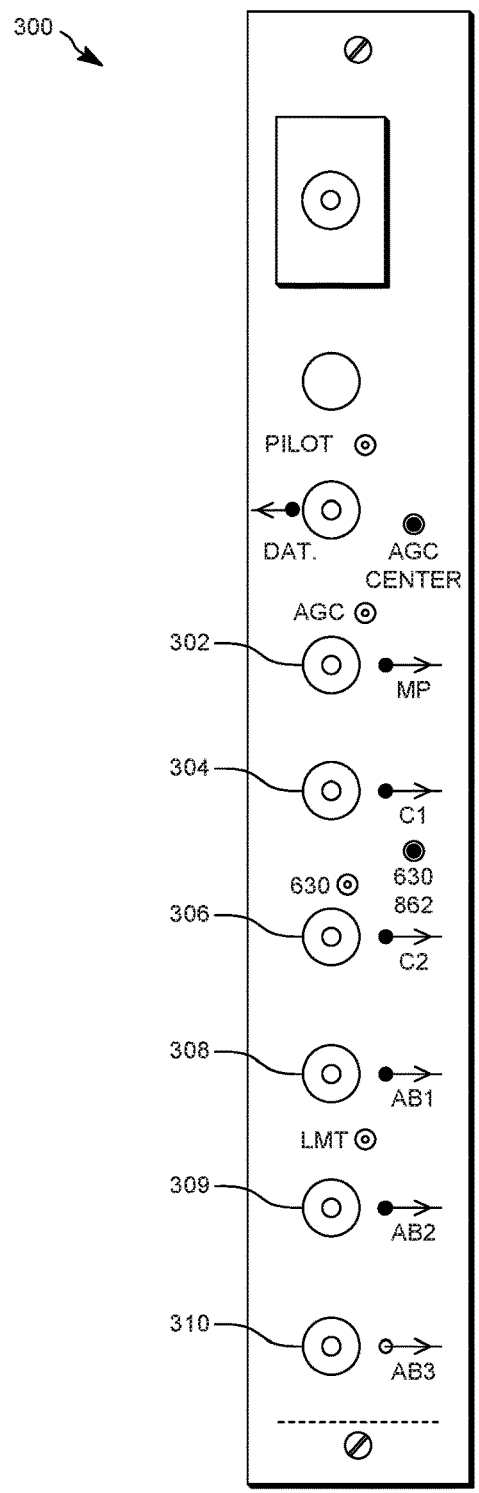
FIG. 3A depicts a block diagram of the front view of a slot comprising an A/B amplifier module.
Figure 3B:
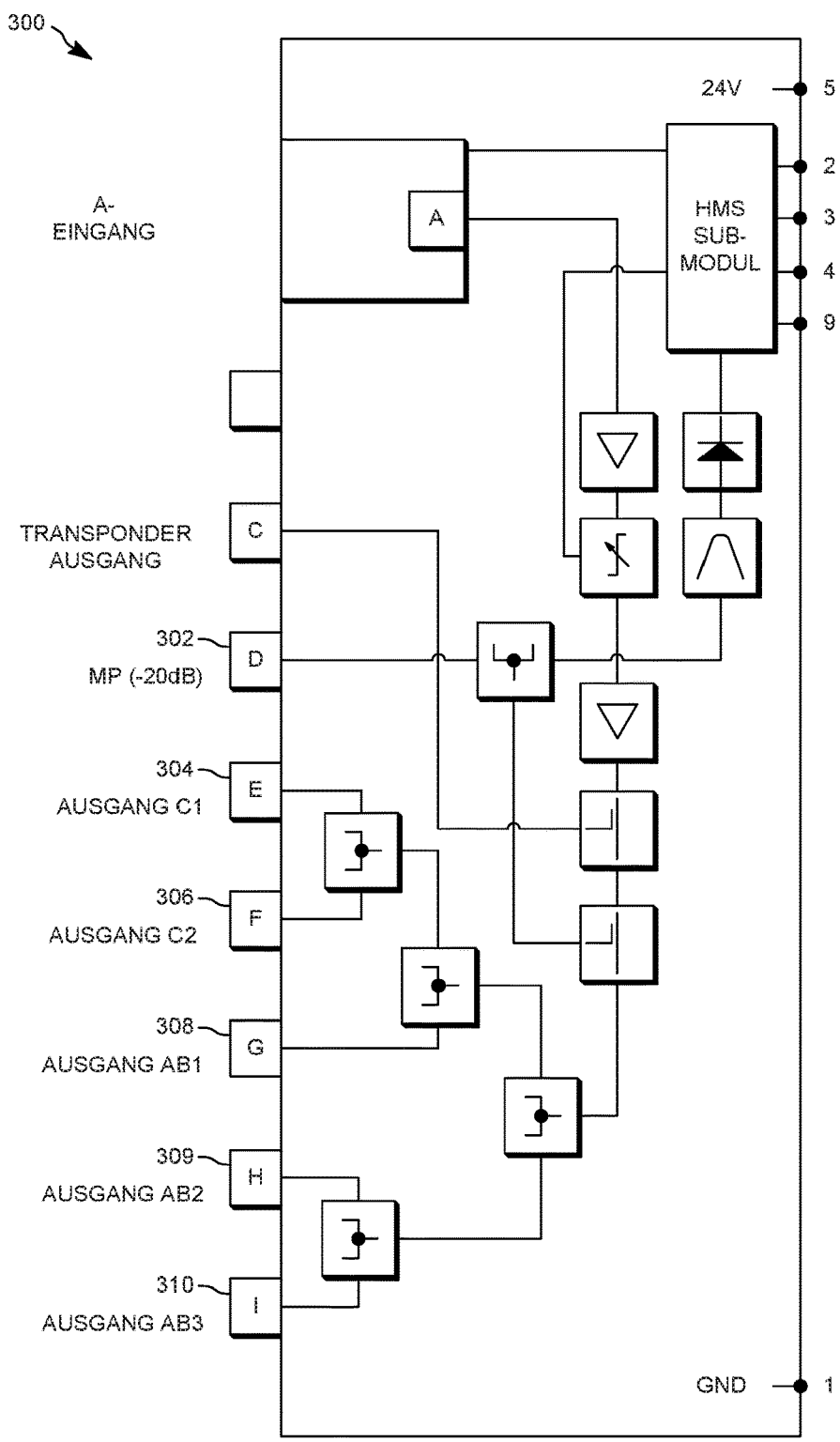
FIG. 3B depicting the interior mechanisms of the AB amplifier module.

FIG. 3A depicts a block diagram of the front view of a slot comprising an A/B amplifier module 300, and FIG. 3B depicting the interior mechanisms of the AB amplifier module 300. The A/B amplifier 300 includes at least one input for a pluggable equalizer 302, 2 outputs for C-modules 304 and 306, and 3 outputs for A/B trunk lines 308, 309, 310. Prior designs required a slot dedicated to insertion of such A/B amplifier.

Figure 4C:
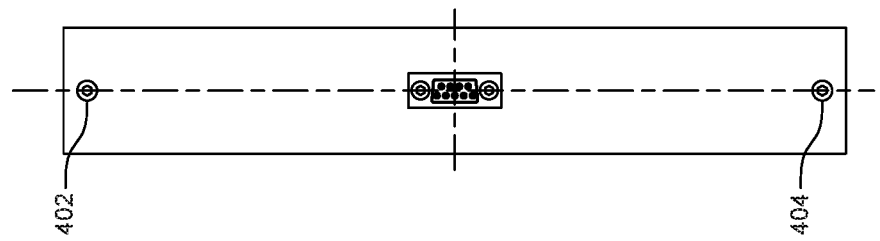
FIG. 4C depicts the back view of the BK module housing.
Figure 4B:
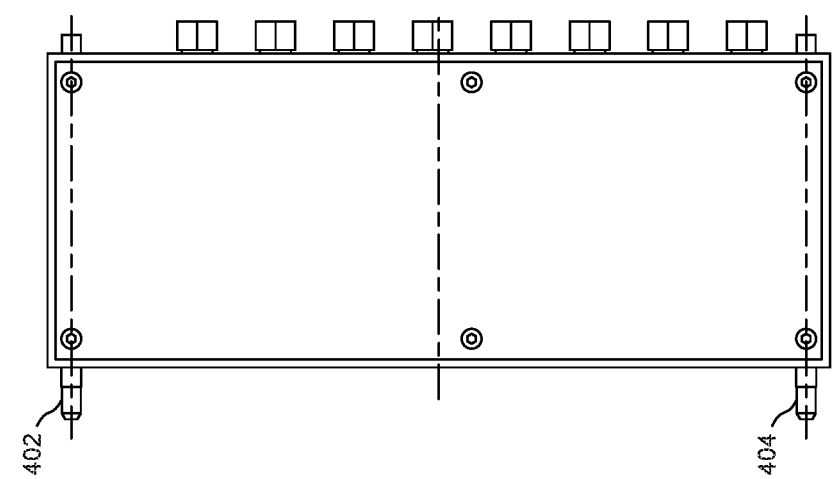
FIG. 4B depicts a side view of the BK module housing.
Figure 4A:
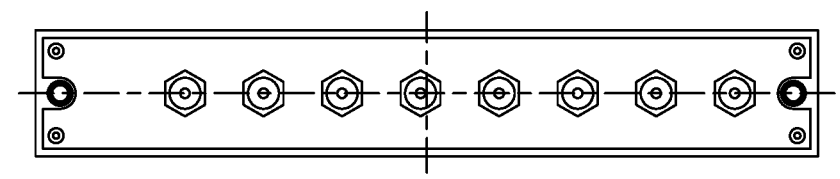
FIG. 4A depicts a front view of the BK module housing having received an amplifier module, such as the amplifier module depicted in FIGS. 3A and 3B.

FIGS. 4A, 4B, and 4C depicts different views of a BK module housing with an example of sizing information for each slot in the BK housing. FIG. 4A depicts a front view of the BK module housing having received an amplifier module, such as amplifier module 300 depicted in FIGS. 3A and 3B. The spacing between ports on the face of the amplifier module 300 is 25.0 mm which equals 175 mm of spacing to accommodate 8 ports (and the 7 spaces between them). Thus, the BK module housing for this example amplifier module requires a slot size that can accommodate this module. FIG. 4B depicts a side view of the BK module housing, where the front of the BK module housing is facing to the right, as shown by the ports of the received amplifier module. In this view, it is shown that the BK module housing is 100 mm in width plus a spacing of 10.5 mm to accommodate the protrusion of the module ports. Further, the connector legs 402 and 404 protruding from the back of the BK module housing are a length of 16.4 mm. 6.4 mm being the insertion for a connector M6. And FIG. 4C, which depicts the back view of the BK module housing shows that the distance between the connector legs 402 and 404 as 235 mm. The width of the BK module housing is 40 mm.

Based on the configuration of the BK housing, there may be a maximum space available for the RPD. For example, in embodiments with 2 slots as configured in FIG. 4, the maximum available space for an RPD may be defined by a footprint having a size of 240×80 mm and a height of 110 mm. For a 3 slot configuration, the maximum available space for an RPD may be defined by a footprint having a size of 240×120 mm and a height of 110 mm.

The table below shows a power envelope in a BK node. Most node configurations are (>90%) are 1:1, which is shown by way of example below. However, it should be understood that the disclosed techniques may be modified to apply to a 2:2 configurations.

| | | Power Consumption of BK Fiber Nodes | | | | | | | |
|---|---|---|---|---|---|---|---|---|---|
| | | Minimum Node Config 1:1 Node | | Typical Node Config* 1:1 Node | | Typical Node Config 2:2 Node | | Maximum Node Config 2:2 Node | |
| BK Module | P sec. [W] | # of Modules | P sec. [W] | # of Modules | P sec. [W] | # of Modules | P sec. [W] | # of Modules | P sec. [W] |
| Optical Transceiver | 4.68 | 1 | 4.68 | 1 | 4.68 | 2 | 9.36 | 2 | 9.36 |
| A/B line Amp | 11.22 | 1 | 11.22 | 1 | 11.22 | 1 | 11.22 | 1 | 11.22 |
| A/B line Amp (2nd) | 11.22 | | 0.00 | | 0.00 | 1 | 11.22 | 1 | 11.22 |
| C-line Amp | 13.44 | | 0.00 | 2 | 26.88 | 1 | 13.44 | 2 | 26.88 |
| RC Amp with HMS Transponder | 5.64 | 1 | 5.64 | 1 | 5.64 | 1 | 5.64 | 1 | 5.64 |
| RC Amp (2nd) | 4.08 | | 0.00 | | 0.00 | 1 | 4.08 | 1 | 4.08 |
| | | Total | 21.54 | Total | 48.42 | Total | 54.96 | Total | 68.4 |

Available Power at secondary terminals "Old" BK Power Supplies in use 72 W
New BK Power Supplies 84 W As illustrated by the example in power envelope table, the available power in a BK node is 84 W (after PS efficiency coefficient). In other words, using a BK power supply feeding the node having a maximum total power of 84 W (prior power supplies, "old" had a max total power of 72 W), the power supply can supply up to 84 W (or dissipate a maximum of 84 W in the housing).

Considering a typical 1:1 node configuration (shown in columns 5 and 6), included is an optical transceiver, an AB line amp, 2 C-line amps, and a RC Amp with HMS Transponder. In this 1:1 node configuration with 1 optical transceiver, 2 c-line, consumes 48.42 watts, where the minimum needed for a return path amplifier (RC Amp with HMS Transponder) is 5.64 W and the two c-line amps each consume 13.44 W (26.88 watts total for two C-line amps). The optical transceiver may span two slots, such as slots 1 and 2, and the A/B line amp may occupy a $3^{rd}$ slot, example slot 3.

However, a migration to the proposed RPD configuration removes the optical transceiver and the A/B line amp in dedicated slots, shown as slots 1, 2, and 3 in FIG. 2A. Thus, removing the optical transceiver and A/B line amp may leave 3 slots (e.g., slots 1-3) open. Instead of the optical receiver and A/B line amp spanning 3 slots, the slots may be replaced with an RPD and adaptor plate.

Figure 5A:
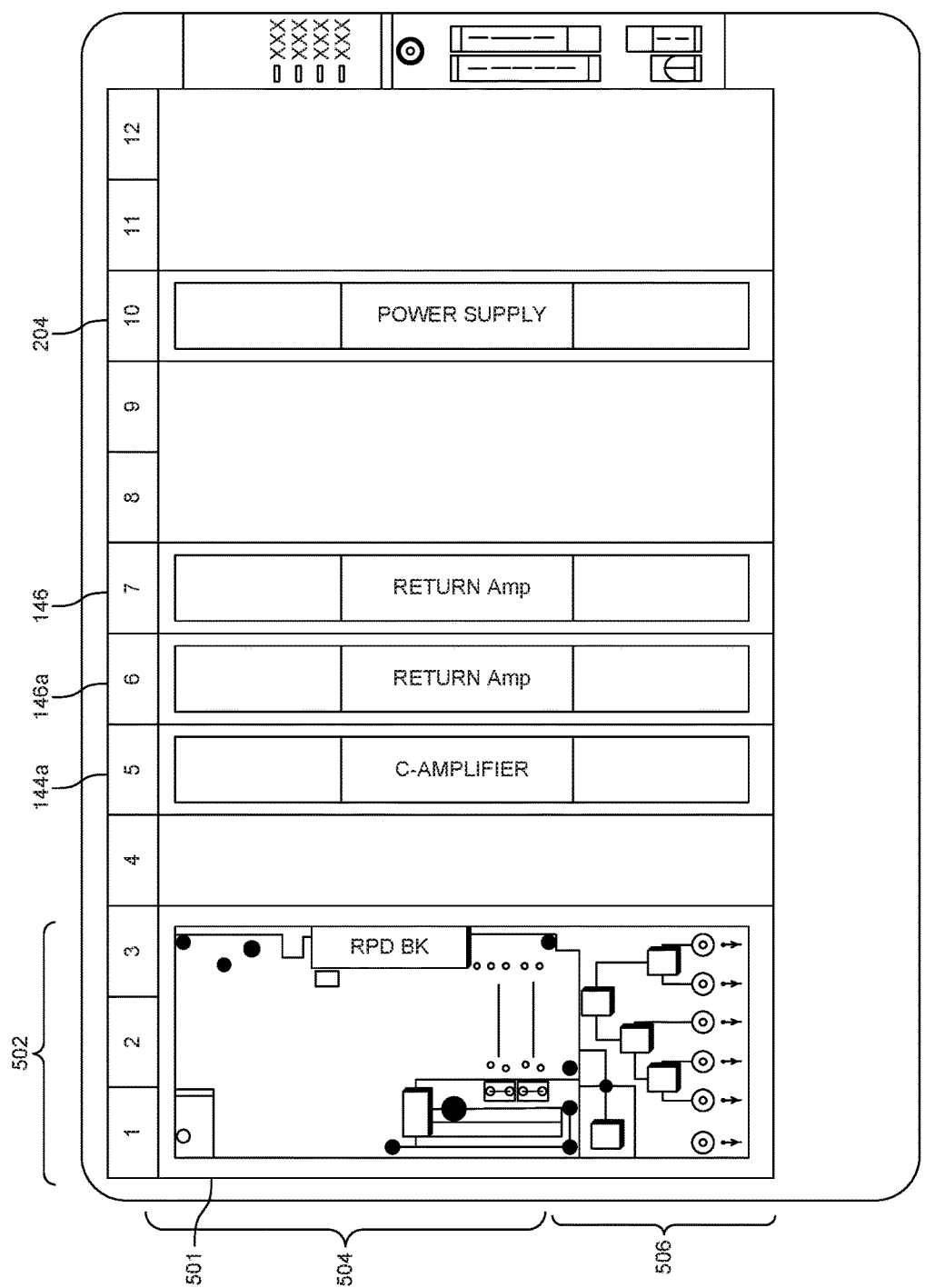
FIG. 5A depicts an embodiment for which an A/B amplifier functionality is integrated into an RPD's back plate.
Figure 5B:
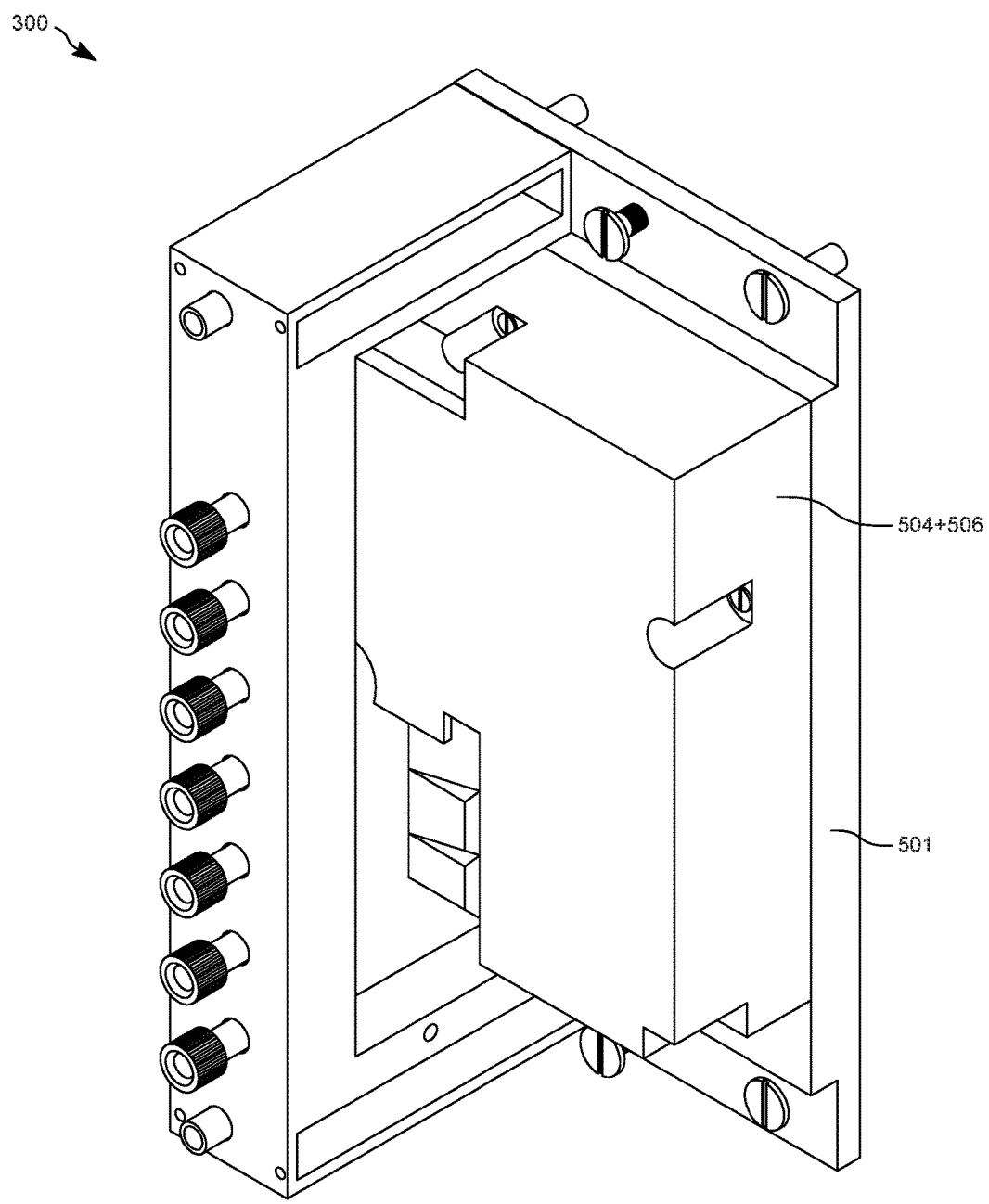
FIG. 5B depicts another embodiment for which an A/B amplifier functionality is integrated into an RPD's back plate.

FIGS. 5A and 5B depict embodiments that include an RPD on a back plate 501 in a BK housing 502 with circuitry of the RPD including amplifier circuitry in the circuits 504 and 506, which may be a single circuit or a combination of circuits. The RPD comprising circuits 504 and 506 is shown generally in a size that is proportionate to the BK housing size shown in FIGS. 4A, 4B, and 4C but spanning the width of three slots. The RPD may be a NC2K/NC4K node that meets the requirements of the BK housing. The input to the adaptor plate may be from the RPD instead of the optical transceiver in current designs that receive an input from a BK receiver. In embodiments, the RPD is mounted on an adaptor plate 501, where the adaptor plate 501 is functional for A/B amplification. Thus, the A/B amp may be integrated with the RPD via the adaptor plate (i.e., integrating an A/B amplifier adaptor plate as a bracket for accepting an RPD in to 3 slots of the BK housing enables removal of the dedicated amplifier slot 3 as shown in FIG. 2A). The circuitry in FIG. 1B may remain the same an included in the RPD, however the transceiver and AB line amplifier functionality is moved to the RPD and the back plate.

Further, by removing dedicated slots for the optical transceiver and A/B line amp, the power consumed by these components is available for the proposed RPD insertion solution. In the example shown by the table above, 51.48 Watts are available for the RPD and the adaptor plate (84 W power from the BK power supply—C-line power—RC amp with HMS transponder power=51.48 W remaining, due to the removal of the optical transceiver and A/B line amp). This is compared to a configuration with without integration of the A/B amp into RPD in which only 40.26 Watt available for RPD (84 W power from the BK power supply—C-line power—RC amp with HMS transponder power—A/B line amp power). Thus, the separate A/B line amp configuration requires an amount of power dedicated to the A/B line amp that leaves less available to the RPD+adaptor plate solution. As can see by this example of one or more embodiments, a higher power envelope is available for the RPD if the adaptor plate is configured to integrate A/B amplification with an RPD received by the adaptor plate.

Embodiments described herein include techniques for utilizing an existing layout for a BK housing, including the existing layout of the RPD, connectors, interfaces, power supplies, and brackets that meet the BK standard. The disclosed RPD+adaptor plate is designed to provide an equivalent A/B amplification of current A/B line amplifiers.

FIGS. 5A and 5B depict embodiments for which an A/B amplifier functionality is integrated into an RPD's back plate, showing an embodiment in which 3 slots are available for installing an RPD on a Back plate without any customization. Further, as described above, the power envelope could be 51.48 Watt. Further, A/B RF configured on to the back plate 501 may avoid modification on the RPD from a standard-provided NC4K/2K version. The RPD and/or back plate solution may require an exact output configuration & RF levels as for the current A/B module.

As shown, the RPD is the correct size proportion to the BK housing, and the power bus in BK housing is 24 VDC. The disclosed techniques work with existing BK housing dimensions, shown in FIG. 4. As shown, with a slot width of 40 mm, two slots are not sufficient for an RPD built with a width that is larger than 80 mm. For example, an RPD housing embodiment has a width that is >80 mm. Two slots only provide for 80 mm of space, whereas 3 slots provides 120 mm of space. An RPD having a size larger than 80 mm, for example, would need at least 3 slots having a width of 40 mm. For example, for an RPD of width 81-120 mm could be inserted in to the three slot space.

As disclosed herein, removing the dedicated slots for the optical transceiver and the A/B line amplifier and instead integrating the A/B amplifier functionality in to the RPD which uses the RPD slot with the available 3 slots enables an increase in power dissipation for the RPD. For example, as described herein, a slot in BK housing designed to BK standards has a limited power dissipation of 15 Watts. For an RPD that consumes more than 30 Watts, more than 2 slots are required for proper power dissipation. In embodiments, the RPD requires>30 Watts, without the integration of the A/B amplifier. Thus, the 3 slot embodiment described herein may accommodate an RPD that consumes>30 Watts. Based on the width consideration, the disclosed embodiments may accommodate an RPD with a width>80 mm that also consumes>30 Watts.

In embodiments, an analog forward path return is integrated. For example, an analog receiver may be integrated as a plug-in option. Such embodiment may be desirable for deployments of the BK housing with broadcast content. Further, the analog receiver may have lower power and low space requirements. In many applications, a low cost receiver up to 860 MHz would be sufficient in a BK housing.

Implementations for handling sweeping and HMS and FM signals are desired in the disclosed RPD design in a BK housing. But, by integrating the A/B amplifier into the adaptor plate, the 3 slots (with a total power dissipation capacity of up to 45 watt) can be used for the RemotePHY module. Any 2-slots solution suffers today from a power dissipation limitation of the BK housing and will have to wait for the next generation of RPD chipsets.

Together with the hardware of the RemotePHY module comes all the additional upgrades to the Core MAC layer (E6000) and the service licenses.

Figure 6:
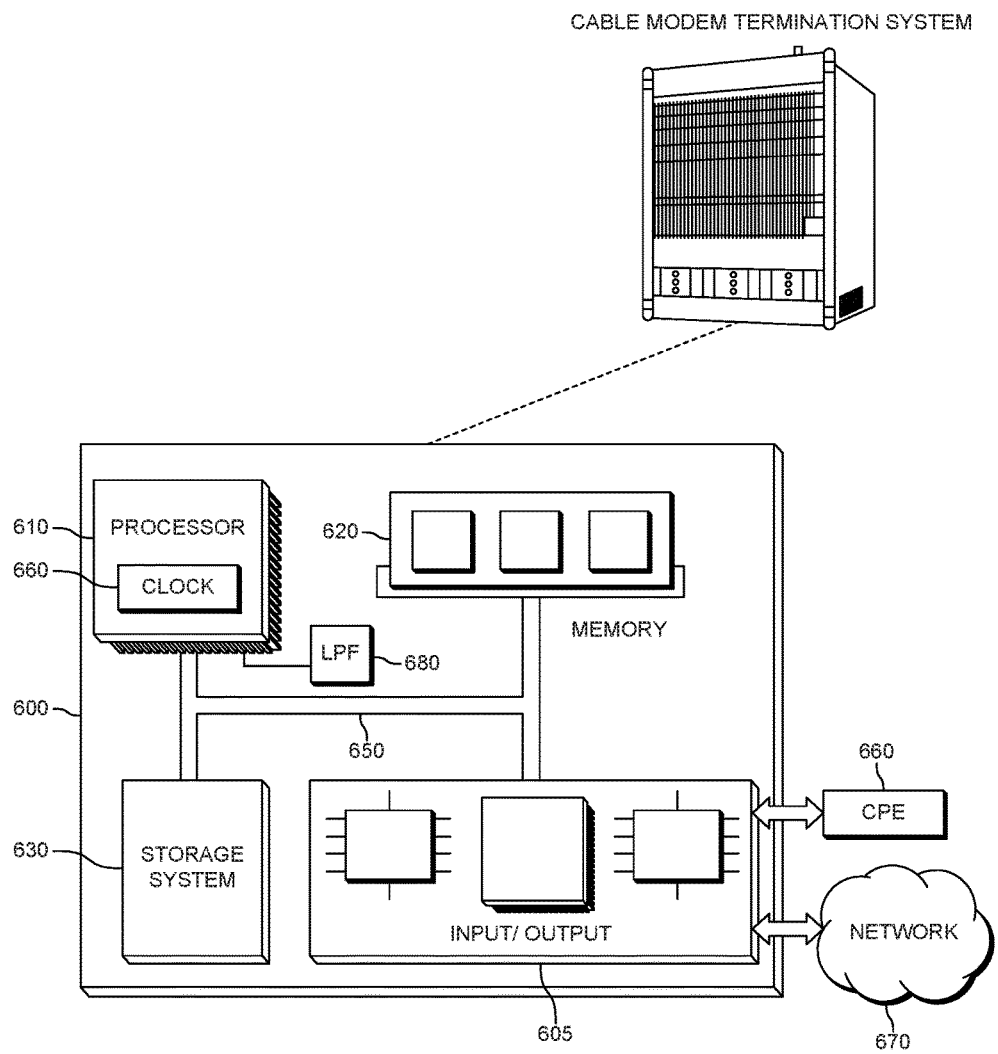
FIG. 6 is a block diagram of a hardware configuration operable with a portion of the BK amplifier module described herein.

FIG. 6 is a block diagram of a hardware configuration 600 operable with a portion of or some of the concepts described herein. It should be understood that the hardware configuration 600 can exist in various types of devices. The hardware configuration 600 can include a processor 610, a memory 620, a storage device 630, and an input/output device 640. Each of the components 610, 620, 630, and 640 can, for example, be interconnected using a system bus 650. The processor 610 can be capable of processing instructions for execution within the hardware configuration 600. In one implementation, the processor 610 can be a single-threaded processor. In another implementation, the processor 610 can be a multi-threaded processor. The processor 610 can be capable of processing instructions stored in the memory 620 or on the storage device 630.

The memory 620 can store information within the hardware configuration 600. In one implementation, the memory 620 can be a computer-readable medium. In one implementation, the memory 620 can be a volatile memory unit. In another implementation, the memory 620 can be a nonvolatile memory unit.

In some implementations, the storage device 630 can be capable of providing mass storage for the hardware configuration 600. In one implementation, the storage device 630 can be a computer-readable medium. In various different implementations, the storage device 630 can, for example, include a hard disk device, an optical disk device, flash memory or some other large capacity storage device. In other implementations, the storage device 630 can be a device external to the hardware configuration 600.

The input/output device 640 provides input/output operations for the hardware configuration 600. In one implementation, the input/output device 640 can include one or more of a network interface device (e.g., an Ethernet card), a serial communication device (e.g., an RS-232 port), one or more universal serial bus (USB) interfaces (e.g., a USB 2.0 port)

and/or a wireless interface device (e.g., an 802.11 card). In another implementation, the input/output device can include driver devices configured to send communications to, and receive communications from one or more networks (e.g., subscriber network from content provider 105 of FIG. 1, network(s) 150 of FIG. 1, etc.). In implementations, the input/output device 640 can include driver devices configured to receive input data and send output data to other input/output devices, such as one or more CPE devices 660 (e.g., set top box, cable modem, etc.), as well as sending communications to, and receiving communications from a network 670. Other implementations, however, can also be used, such as mobile computing devices, mobile communication devices, set-top box television client devices, etc.

In one or more examples, the functions disclosed herein may be implemented in hardware, software, firmware, or any combination thereof. If implemented in software, the functions may be stored on or transmitted as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses. Various components, modules, or units are described in this disclosure to emphasize functional aspects of components configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

I claim:

1. A method for enabling a high power envelope for a remote PHY device (RPD) in a housing having a plurality of slots, the method comprising:
    inserting an adaptor plate configured for A/B amplification as a bracket having a width spanning more than two of a plurality of slots in to a BundesKabelnetz (BK) standard housing, the adaptor plate configured for receiving the RPD, the RPD having a width greater than a slot width of one slot in the standard housing; and
    coupling the adaptor plate and RPD with the standard housing, wherein the A/B amplification integrated with the RPD via the bracket enables the higher power envelope for the RPD than an RPD spanning two or less slots.

2. The method of claim 1, wherein the adaptor plate provides connection to at least 3 slots in the housing, and the RPD is received by the adaptor plate for spanning the at least 3 slots.

3. The method of claim 1, wherein the RPD and adaptor plate occupy slots 1, 2, and 3 of the housing.

4. The method of claim 1, wherein coupling the adaptor plate and the RPD comprises at least one of mounting the RPD to the adaptor plate or mounting the adaptor plate to the RPD, before or after insertion in to the housing.

5. The method of claim 1, wherein the RPD has a width>80 mm and consumes>30 Watts of power.

6. The method of claim 1, wherein the RPD has a width of <120 mm.

7. The method of claim 1, wherein the RPD consumes>30 Watts of power.

8. The method of claim 1, wherein integrating the A/B amplification in to the adaptor plate that spans multiple slots in the housing reduces power consumption of an A/B amplifier inserted in to a single slot in the housing.

9. The method off claim 1, wherein integrating the A/B amplification in to the adaptor plate increases space available for the RPD and increases a power envelope of the RPD.

10. An adaptor plate configured to be inserted in to a BundesKabelnetz (BK) standard housing and receive a remote PHY device (RPD) having a width greater than one slot in the standard housing, the adaptor plate comprising:
    a width spanning more than two of a plurality of slots in the standard housing;
    active components for A/B amplification;
    a first mounting component for coupling the adaptor plate with the RPD, the RPD having a width greater than a slot width of one slot in the standard housing; and a second mounting component for coupling the adaptor plate and RPD with the standard housing, wherein the A/B amplification integrated with the RPD via a bracket enables a higher power envelope for the RPD than an RPD spanning two or less slots.

11. The adaptor plate of claim 10, wherein the adaptor plate provides connection to at least 3 slots in the housing, and the RPD is received by the adaptor plate for spanning the at least 3 slots.

12. The adaptor plate of claim 10, wherein the RPD and adaptor plate occupy slots 1, 2, and 3 of the housing.

13. The adaptor plate of claim 10, wherein coupling the adaptor plate and the RPD comprises at least one of mounting the RPD to the adaptor plate or mounting the adaptor plate to the RPD, before or after insertion in to the housing.

14. The adaptor plate of claim 10, wherein the adaptor plate is configured to receive the RPD having a width>80 mm and consumes>30Watts of power.

15. The adaptor plate of claim 10, wherein the adaptor plate is configured to receive the RPD with a width of <120 mm.

16. The adaptor plate of claim 10, wherein the adaptor plate is configured to receive the RPD that consumes>30 Watts of power.

17. The adaptor plate of claim 10, wherein integrating the A/B amplification in to the adaptor plate that spans multiple slots in to the housing reduces power consumption of an A/B amplifier inserted in to a single slot in the housing.

18. The adaptor plate off claim 10, wherein integrating the A/B amplification in to the adaptor plate increases space available for the RPD and increases a power envelope of RPD.

* * * * *